United States Patent [19]

White

[11] Patent Number: 5,822,172

[45] Date of Patent: Oct. 13, 1998

[54] APPARATUS AND METHOD FOR TEMPERATURE CONTROL OF WORKPIECES IN VACUUM

[75] Inventor: Nicholas R. White, Wenham, Mass.

[73] Assignee: Varian Associates, Inc., Palo Alto, Calif.

[21] Appl. No.: 779,899

[22] Filed: Jan. 7, 1997

Related U.S. Application Data

[63] Continuation of Ser. No. 323,764, Oct. 17, 1994, abandoned.

[51] Int. Cl.⁶ .................................................. H02N 13/00
[52] U.S. Cl. ........................................... 361/234; 279/128
[58] Field of Search ........................... 361/234, 231–233, 361/235; 279/128

[56] References Cited

U.S. PATENT DOCUMENTS

| | | | |
|---|---|---|---|
| 5,103,367 | 4/1992 | Horwitz et al. | 361/234 |
| 5,315,473 | 5/1994 | Collins et al. | 361/234 |
| 5,436,790 | 7/1995 | Blake et al. | 361/234 |
| 5,444,597 | 8/1995 | Blake et al. | 361/234 |
| 5,452,177 | 9/1995 | Frutiger | 361/234 |
| 5,474,614 | 12/1995 | Robbins | 118/728 |

*Primary Examiner*—Fritz Fleming
*Attorney, Agent, or Firm*—William R. McClellan; James M. Williams; Bradford L. Friedman

[57] ABSTRACT

A flat workpiece is placed in contact with a flat platen in a vacuum chamber, and is held by a uniformly-distributed force while a small mass flow of gas is introduced along a contour to form a uniform pressure region between the flat workpiece and the platen. Separation of the two surfaces due to aplanarity or surface roughness is less than the gas mean free path, and high rates of heat transfer are obtained uniformly over the area of the workpiece. A scavenging port, located outwardly of the gas introduction contour is differentially pumped to reduce the rate of gas leakage into the chamber. Preferably, pressure is provided by an electrostatic clamp (for non-insulating substrates) or other clamping arrangement which does not occlude the front surface of the workpiece. In the electrostatic clamp, the voltage activation sequence prevents workpiece vibration, while a clamping current sensor immediately detects degree of contact, e.g., due to debris on the platen, and initiates a suitable warning or control. High cooling rates, freedom from bowing or stress, and full utilization of front surface area are all achieved.

5 Claims, 6 Drawing Sheets

APPARATUS AND METHOD FOR TEMPERATURE CONTROL OF WORKPIECES IN VACUUM

This application is a continuation application of Ser. No. 08/323,764 filed on Oct. 17, 1994, now abandoned. The aforementioned application is hereby incorporated by reference.

BACKGROUND OF THE INVENTION

The present invention relates to temperature control of a workpiece being processed on a treatment stage in a vacuum chamber, and more specifically to gas-assisted cooling of workpieces such as semiconductor wafers or flat-panel displays undergoing processes such as ion implantation in vacuum, or to gas-assisted cooling or heating of the workpieces undergoing similar processing.

During the doping of silicon wafers by ion implantation in the manufacture of microelectronic circuits, energy of up to several hundred joules per square centimeter is deposited in a thin silicon wafer. For commercial reasons, this energy must be deposited in a short time interval, so the processes require the wafer temperature to be controlled in a range, depending on the process, which is typically below 100° Celsius. Thus some means of heat removal is generally necessary. Historically, high-current ion implantation has been performed in batches of up to 25 wafers, with each wafer is carried or rotated in front of the beam during a sequence of brief sub-intervals of the treatment cycle. This arrangement reduces the average heating rate and allows modest heat removal rates naturally occurring through radiation and conductive contact with the carrier to maintain acceptably low wafer temperatures. In some implanters and for many other processes, however, the wafers are processed one at a time mechanically clamped against a cooled platen. Sometimes gas is introduced behind the wafer to enhance heat removal from the wafer, as described in U.S. Pat. No. 4,261,762, of inventor King, and in some processes the wafer may even be actively heated by similar means. For gas cooling, a full-ring or multi-point clamp presses the wafer against a sealing ring formed of an elastomer. In one process of this type, as described in U.S. Pat. No. 4,457,359, of inventor Holden, the pressure of the cooling gas causes the wafer to become domed. Such doming is undesirable because the spacing of the wafer from the platen is difficult to control and the gas cooling is strongly dependent on this spacing. Furthermore, doming introduces stress in the wafer that may cause damage, and it causes a variation in the angle of incidence of the ions at the wafer surface due to the curvature of the wafer, which in turn may cause other undesirable process variations. It is therefore preferable to mount or otherwise maintain the wafer flat.

It is also desirable, however, to avoid contacting the front side of the wafer with a clamp, since a clamp masks part of the wafer from the processing, and this wastes a portion of the wafer material. Clamping also causes local stresses which may lead to damage or breakage, and can generate particles which interfere with proper processing, and can cause particles or debris to become embedded in the wafer. Front surface clamps may also be struck by the ion beam, or exposed to other processes, and are therefore a source of sputter contamination.

Most preferably, one would cool the backside of the wafer without causing any significant deformation of the wafer, apply a fairly uniform pressure over the full surface of the wafer, and avoid clamping with a concentrated force at the periphery. However it is essential to keep the rate of leakage of gas from the backside of the wafer at a level well below other sources of gas which already compromise the quality of the vacuum and present a load on the pumping systems, and it is also desirable, if leakage must occur, to tightly control the leakage of gas. There is thus generally a trade-off between process effectiveness, on the one hand, and the use of clamping or gas cooling on the other hand, which would limit application of gas cooling to relatively high pressure processes, such as RF sputtering.

SUMMARY AND OBJECTS OF THE INVENTION

It is therefore an object of this invention to heat or cool a workpiece undergoing processing in vacuum without clamping or contacting the side of the workpiece which is undergoing processing.

It is a further object of this invention to control the amount of gas which leaks into the vacuum chamber from the space between the workpiece and the surface on which it is supported, such that the leakage of gas does not adversely affect the processing of the wafer.

It is a further object of this invention to minimize and control sources of damage and contamination which have tended to accompany prior techniques of thermoregulation.

In accordance with the present invention, the temperature of a workpiece, such as a wafer, is controlled in a vacuum chamber by fixing the wafer on a flat platen and introducing a heat transfer medium in a peripheral region of the wafer between the wafer and platen. The wafer is urged against the platen with a low contact pressure distributed over its surface, and the opposed faces of the wafer and of the platen are both smooth and flat so that the heat transfer medium fills a space essentially defined by surface roughness of the contacting objects. The roughness is kept low enough that the heat transfer rate is high and the wafer is conductively cooled to the temperature of the platen. Centrifugal, magnetic (for ferromagnetic workpieces) or electrostatic clamping (for resistive workpieces), are employed to achieve an even force distribution over the whole surface of the workpiece without covering any portion of the face. A vacuum channel formed in the surface of the platen may scavenge the heat transfer fluid by differential pumping to keep the amount of residual fluid leaking out from under the wafer from degrading chamber pressure. Preferably, a flatness is maintained of better than 10–20 microns across the workpiece and the platen surface, and a surface roughness kept below approximately 0.8 microns so that when clamped together the workpiece and platen provide a fluid thermal contact space with leakage to the vacuum chamber at a level substantially below the static load from all other process sources. An electrostatic clamp includes a plurality of long, thin electrode regions which are activated in a sequence different from their spatial ordering to provide a non-motoring but dynamic pattern of clamping forces.

BRIEF DESCRIPTION OF THE DRAWINGS

These and other features of the invention will be understood from the description below, illustrated by exemplary figures, wherein:

FIGS. 8b and 8c show details of construction of the electrostatic clamp of FIG. 8a;

DETAILED DESCRIPTION

The patents of King and Holden mentioned above describe apparatus and methods for gas-assisted heating and cooling of workpieces undergoing treatment in vacuum using mechanical clamps which make contact with the front (processed) side of the workpiece, and which use peripheral seals to confine a cooling gas. Others have suggested that fluid cooling, with some leakage is more effective than metal-to-metal contact, for some applications, but have not addressed the complex trade-off between such factors as clamp pressure, gas species, leakage and cooling rates. The invention is best understood following a detailed consideration of the overall approach shown in the aforesaid two patents.

Figure 1:
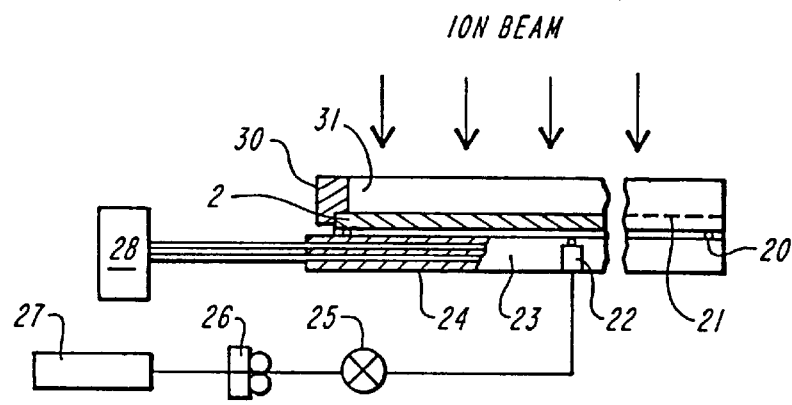
FIG. 1. shows a prior art cooling mechanism.

In one prior art construction shown in FIG. 1, a semiconductor wafer 2 is clamped with a ring clamp 30 against a cooled flat support member 23. An O-ring 20 set in the surface of the support 23 directly opposite the ring clamp provides a seal to confine gas which is introduced under pressure through an orifice 22 into the space between the wafer and the support member. This technology has been used in ion implantation, but has disadvantages which include applying stress to the wafer, and generation of particles on the front side of the wafer, loss of usable area of semiconductor wafer material due to masking by the clamp ring, sputtering of contaminants from the clamp ring onto the wafer, and a less than optimal cooling effectiveness, since the cooling which can be obtained is reduced due to bowing of the wafer under the influences of localized clamping on the front and uniform gas pressure on the rear surfaces.

Figure 2:
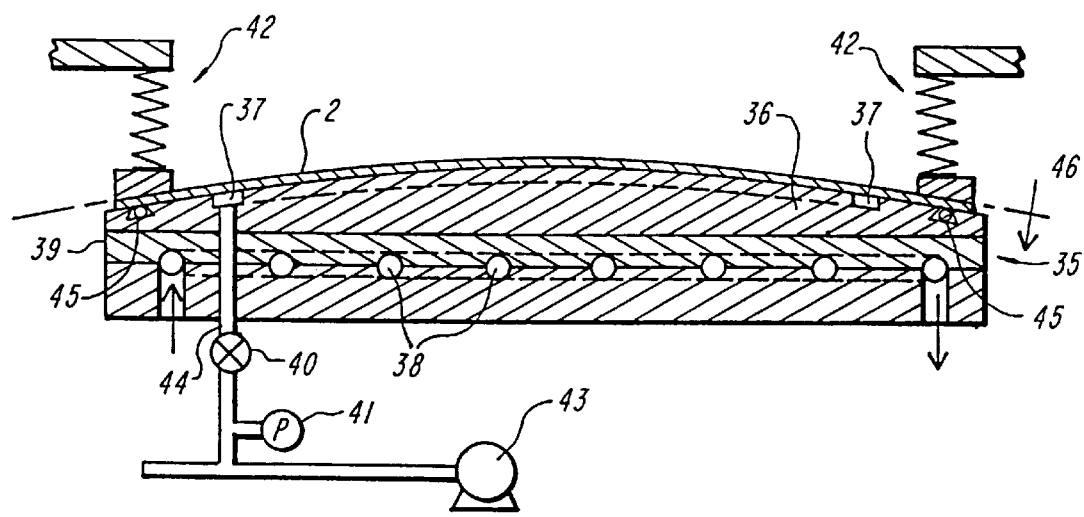
FIG. 2 shows another prior art cooling mechanism.

In another construction of the prior art shown in FIG. 2, the tendency of the cooling gas to cause the wafer to bow is recognized and addressed. In this construction, a platen 36 is gently domed so that the action of clamping the wafer 2 at its periphery with ring 42 against the platen 36 causes the wafer to gently bend over the platen and to bear against the platen with an approximately uniform degree of contact prior to introduction of gas under pressure through channel 37. The domed shape of the platen prevents the separation of wafer and platen, at moderate gas pressures. As discussed in the cited patents, too great a separation is known to reduce the level of obtainable thermal transfer, so this construction attains better cooling characteristics. Disadvantages of this approach, however, include the variation of the angle of incidence of the ion beam over the wafer surface due to the wafer curvature, which as discussed above, lead to undesirable process variations. Those include planar channeling, and breakage of wafers with pre-existing defects, as well as the aforementioned general disadvantages of front-surface clamping.

Figure 3:
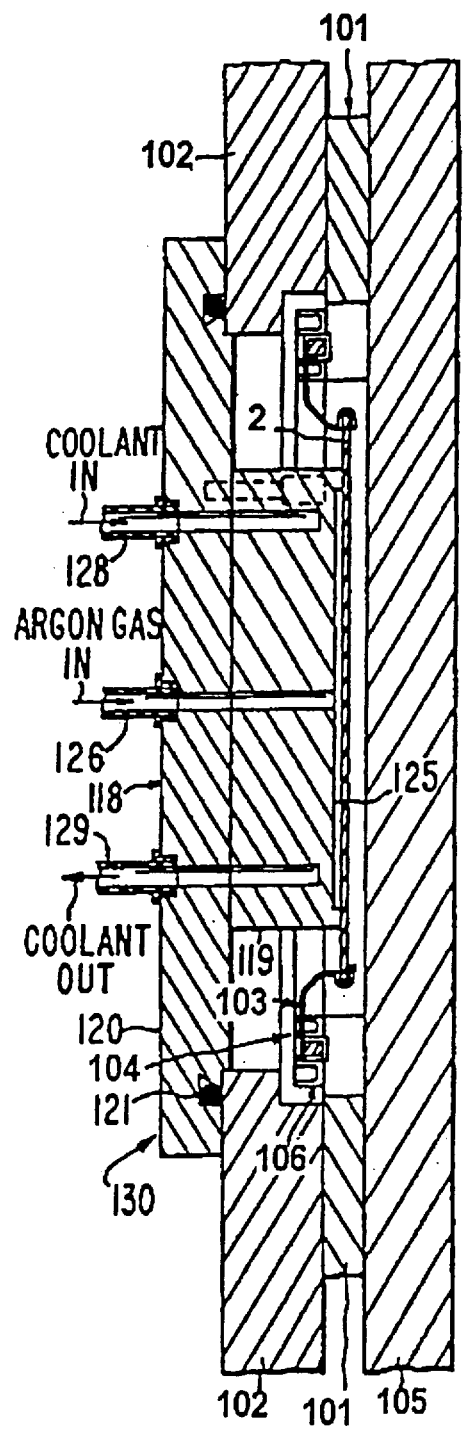
FIG. 3 shows another prior art cooling mechanism.

FIG. 3 shows a variation of the prior art approach shown in FIG. 1, with the stage, clamping, and cooling mechanisms integrated into a wafer holding assembly. In this embodiment, the wafer 2 rests vertically against a heat sink member 119 that is actively cooled by a flow of fluid through inlet and outlet tubes 128, 129. The front face of the member 119 has a central flat recessed floor 125, and a plurality of small clip assemblies 103, which each are moved by a machine actuated mechanism 104, hold the wafer 2 down against a peripheral lip of the heat sink, so that the wafer is close-to, but not touching the face 125. A central gas inlet feeds argon at 100–1000 microns pressure into the space between the wafer and heat sink to raise the pressure and increase the rate of heat transfer. When used for heating a wafer the gas may be heated. When used for cooling, the gas pressure is ten or more times greater than the residual gas pressure in the chamber, and a certain amount of the heat transfer gas leaks out past edges of the wafer to maintain the normal ten micron chamber pressure of a sputtering chamber. The heat sink is mounted on a backing plate 120 that seals against the vacuum chamber wall 102 via an O-ring seal 121, and when not in its operative position, the opening in wall 102 is covered by a pressure plate 105 and seal ring 101. Both the gas introduction passage 126 and the fluid heat exchange passages 128, 129 for the heat exchange plate pass through the backing plate 120. While the edge clips 103 reduce somewhat the wasted wafer area given over to the clamp ring in the construction of FIG. 1, the problems inherent in that construction remain.

The present invention departs from these prior art approaches in providing gas under pressure as a thermal transfer medium into a space of random variations formed between two flat and mutually contacting surfaces while the workpiece is urged with a force distributed over its entire surface against a platen over a broad contact area. Gas is introduced along a peripheral line contour to provide substantially uniform thermal conduction. Typically, the workpiece is a thin flat wafer, and the workpieces are heated or cooled by mounting each workpiece to a very flat platen with substantially uniform pressure, and by introducing the gas between the wafer and the platen. The platen is made as flat as practical, preferably better than ±0.0005", with the exception of holes and grooves for the transfer medium as described further below, and is polished smooth.

Advantageously, no attempt is made to create a hermetic seal in any localized region between the wafer and the platen which would require local pressures many orders of magnitude greater than the mean pressure. Rather, both the platen and the workpiece are made sufficiently flat to come into uniform contact or substantially uniformly contacting proximity, and are made smooth with a microscopic roughness preferably not exceeding 32 micro inches. The gas occupies the microscopic valley spaces in the surfaces of the platen and the workpiece. A small rate of leakage of gas from the edges of the platen is matched by a constant flow of gas introduced by way of a groove or ring of holes in the platen surface, running along a contour fairly close to the edge of the wafer, into the region between the workpiece and the platen. The area of gas introduction forms an isobaric boundary around the center of the wafer space, which otherwise has no gas outlet. This assures that, despite the irregular shape and very narrow dimension of the space occupied by the transfer medium, the gas remains distributed uniformly under the workpiece, in a wafer-to-platen gap that is smaller than the mean free path length of the gas. Conductive heat transfer is therefore maximized.

Rather than the prior art clamping forces localized at the periphery, in accordance with this invention the pressure applied between the workpiece and the platen is low and is substantially uniform over the full surface of the platen. Suitable clamping forces are applied by gravity (for sufficiently dense workpieces and/or low enough gas cooling pressure), centripetal acceleration, magnetic clamping (for ferromagnetic workpieces) or electrostatic clamping (for moderately conductive workpieces such as silicon wafers).

Figure 4A:
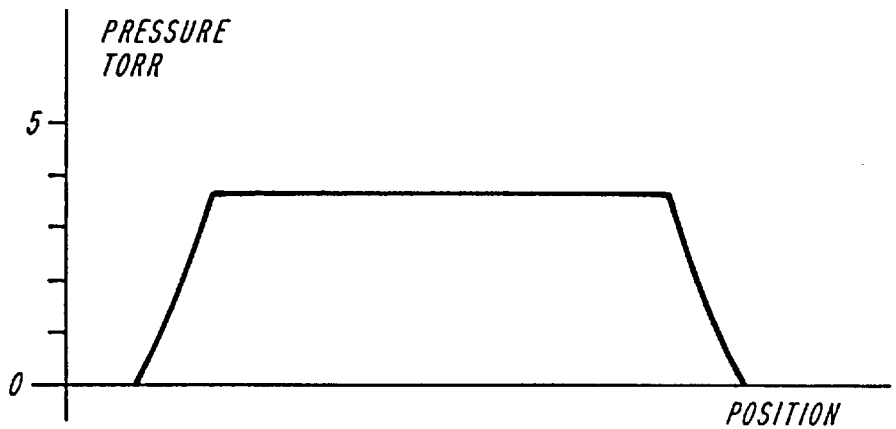
FIGS. 4 and 4a show a basic embodiment of the present invention and illustrate the distribution of pressure therein.
Figure 4:
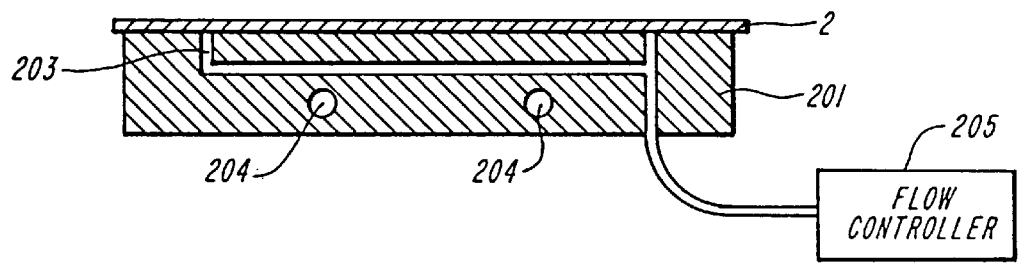

FIG. 4 shows this construction. A flat thin workpiece 2 is placed in high vacuum upon a flat platen 201, through which a liquid such as water is passed in channels 204. The liquid can be heated, cooled or maintained at a reference temperature as required for the process and substances involved. A gas is introduced at a flow controlled by flow controller 205 at a rate of approximately 0.25 sccm into a conduit or channel that feeds via a ring or circular groove 203 into the interface between the workpiece and the platen. This groove or ring of holes 203 is referred to below as the gas introduction ring. Notably, while in prior art constructions the pressure of the cooling gas is controlled, in accordance with this invention the mass flow is controlled. This important difference produces effects in several ways described more fully below which, in conjunction with the lack of a peripheral seal and the use of highly flat surfaces, assure that both the pressure and the nominal thermal transfer gap spacing are kept quite low, while obtaining high rate of heat transfer.

When a wafer is partially covered with a photoresist mask undergoing ion implantation, the photoresist alone can be a source of several standard cubic centimeters per minute (sccm) of hydrogen gas liberated by the action of the ion beam on the organic photoresist. Thus the leakage by a wafer cooling system of a small fraction of one sccm of gas, possibly hydrogen, may not significantly affect the implantation process, particularly if the reduction in temperature of the wafer achieved by such cooling has a compensating negative effect upon the volume of hydrogen being liberated by the resist. Thus, the gas cooling system may safely introduce a certain amount of gas, especially if, as described above, the amount of cooling gas is less than the amount by which the temperature change reduces outgassing. Based on this realization, applicant has determined a structure for a heat exchange platen to operate with such a defined flow of gas leakage.

If the surfaces were perfectly flat, then such a regulated flow of gas would theoretically cause the workpiece to lift off the platen to a distance just sufficient to allow the flow of gas to escape at the edges of the platen. However, in accordance with applicant's practice, the surface of a semiconductor wafer has a roughness within conventionally attained finishing standards of, for example, twelve micro inches r.m.s., and defects in flatness of up to several ten thousandths of an inch are allowed to occur. Applicant advantageously utilizes these surface variations to maintain firm contact between the workpiece and the platen with additional conductive heat transfer effected by a gas at low gas pressure and flow rates matched to the irregular interstitial heat transfer space defined by the foregoing surface finish features, as discussed further below.

FIG. 4a shows a graph of gas pressure within the wafer/platen interstitial space as a function of position from one side of the wafer to the other. Inside the gas introduction contour, ring 203, the pressure of gas reaches a steady state shortly after the gas flow commences. In practice, this pump-up interval is found to be one second or less.

If the gas were simply to be introduced through a hole at the center of the wafer/platen assembly, as is the case in some existing commercial equipment (for example, via the elements depicted in the above described prior art as element 22 in FIG. 1, or 126 in FIG. 3), the pressure profile beneath the wafer in the absence of the mechanical edge clamping and elastomer sealing shown would be high at the center relative to the edges. This would introduce non-uniform heat transfer, and the rate of gas leakage would also have to be much higher to maintain suitable pressure at the edge. The introduction of the gas according to this invention in a contour close to the edge of the platen allows the pressure to come to static equilibrium over an interior region covering the greater part of the space between the wafer and the workpiece, as shown by the pressure profile in FIG. 4a, without requiring such high pressure to achieve effective heat conduction. Applicant achieves this without use of clamp rings or seals, and is therefore able to avoid pressure-distortion of the wafer.

Figure 4B:
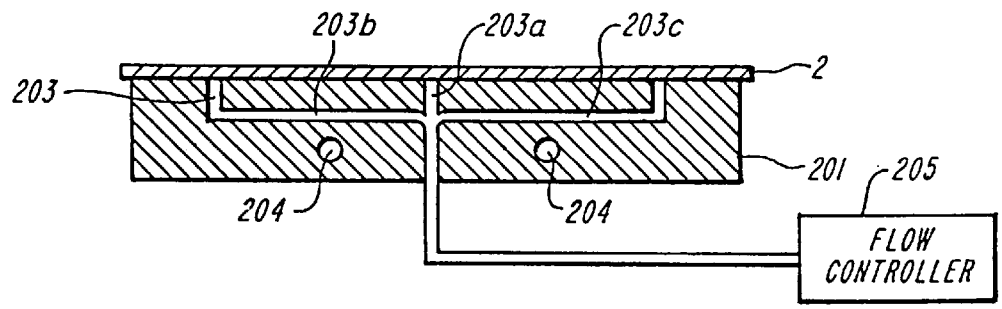
FIG. 4B shows another embodiment.

In an alternative embodiment shown in FIG. 4B, the platen may be provided with a gas introduction hole 203a at its center, as in FIG. 1, but with this hole linked by one or more grooves 203b, 203c which extend to an outer groove 203 occupying a peripheral contour close to the edge of the platen. The linking groove or grooves 203b, 203c may be located below the face of the platen as illustrated, or may consist of narrow channels in the face itself. In either case, they serve as pressure shunts to uniformize the pressure distribution under the workpiece, again producing a substantially constant pressure distribution as shown in FIG. 4A and allowing operation at a minimal heat transfer fluid pressure simultaneously with minimal distortion of the thin workpiece, and effective thermal regulation is achieved without excessive leakage of fluid into the process chamber.

Operation of the invention may be understood from the following brief discussion.

The region outside the gas introduction ring 203 bounded by the flat wafer and the flat platen has a small conductance of $$C = 2\pi r g^2 c / 3l \tag{1}$$

where $g^2$ is the mean square gap between the wafer and the platen, l is the distance from the gas introduction ring 203 to the outer limit of the gas-cooled region, and r is the radius of the gas introduction ring. Provided the surfaces are sufficiently flat and parallel, the leakage is low enough to eliminate the requirement for seals.

The cooling rate in this region can be shown to be $$Q/A = 0.33 a \gamma k n c (T_w - T_p) \tag{2}$$

in MKSA units, where a is the accommodation coefficient of the gas on the surfaces, $\gamma k$ is the heat capacity per molecule per degree, k is Boltzmann's constant, n is the gas density, c is the mean gas velocity, $T_w$ is the wafer temperature and $T_p$ is the platen temperature. The rate at which gas molecules cross unit area normal to the platen surface transporting energy, which is given by 0.33 nc and thus appears in equation (1), can be evaluated by equating the rate of gas introduction, F, to the rate of gas loss between the workpiece and the platen through the annular space outside the gas introduction ring. Since F=PC, where P is the gas pressure, and P=nkT, nc can be evaluated to be:

$$nc = 3Fl / (2\pi r g^2 kT) \tag{3}$$

where T is the mean temperature.

The rate of cooling is proportional to the gas flow, proportional to the distance from the gas introduction ring 3 to the platen edge, and inversely proportional to the mean square gap. The mean square gap is determined by the surface finish and flatness of the workpiece and of the platen. Interestingly, in these equations the choice of gas only enters through the effect of γ.

Figure 5:
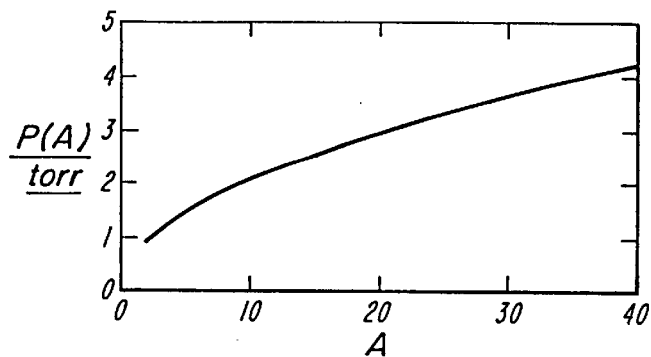
FIG. 5 illustrates gas pressure as a function of molecular weight of the gas species used.

In this discussion two implicit assumptions have been made: that the gas mean free path is greater than the r.m.s. gap between the wafer and the platen so as to maximize the heat transfer rate, and that the gas pressure is less than the time averaged clamping pressure between the workpiece and the platen, so that the gap doesn't change with pressure. The gas pressure which results for a given flow rate depends upon n, which is inversely proportional to c, where $$c^2 = 2kT/M \tag{4}$$

and M is the molecular weight of the gas. Thus, for a given flow rate, a lighter gas develops a lower pressure behind the wafer. The dependence of pressure on an atomic number A is plotted in FIG. 5. To minimize the pressure required, hydrogen is applicant's preferred heat transfer gas.

Figure 6:
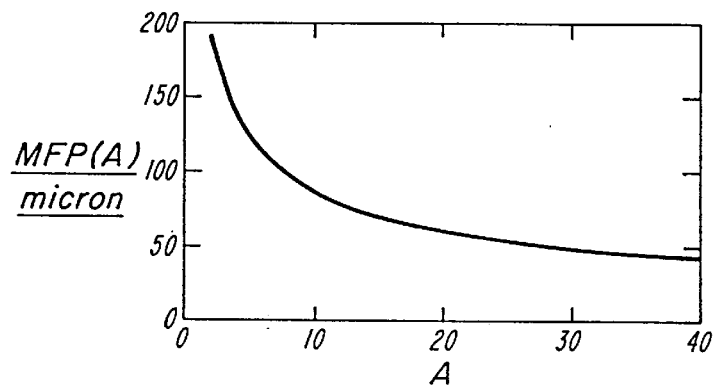
FIG. 6 illustrates mean free path of a gas molecule as a function of molecular weight of the gas.

The mean free path also depends upon the atomic/molecular number A of the gas selected, as shown in FIG. 6. Both pressure and mean free path may also be affected by chemical properties of the gas not discussed further here. The importance of the mean free path is that if it is less than the gap such that a significant number of gas—gas collisions occur between the workpiece and the platen, then the cooling rate is considerably reduced. A discussion of the relationship between the gap and mean free path in their effect in heat transfer rate may be found in the two patents noted above.

It should be noted that the gas heat transfer medium introduced at the periphery of the wafer need not enter via a full circular port. Instead, a plurality of discrete inlet ports 203a, 203b . . . may be distributed along a closed contour in a peripheral region of the platen. In that case, diffusive flow of the gas operates to smooth the overall distribution profile. In each case, the result is a substantially constant and stationary gas profile in the central region, and a small but balanced flow of gas with a decreasing pressure profile across the thin peripheral band region outside of the gas introduction contour.

Note that the pressure within the gas introduction ring is uniform, and, in the absence of localized clamp forces, there are no deflections caused by differential pressures or pinned edges, and the workpiece therefore remains flat. The rate of cooling does not extend uniformly to the edge of the wafer beyond the gas introduction ring, because the pressure drops smoothly from the gas introduction ring to the platen edge, as shown in FIG. 4A. However, consequences of this pressure drop-off effect may be minimized by requiring that the length l between the gas introduction ring and platen edge be small. In accordance with equation (1), to decrease the distance in this fashion increases the gas flow required to obtain a given cooling rate, and therefore undesirably raises the pressure in the vacuum chamber.

However, despite the greater flow with small l, applicant has determined that it is not necessary to use a localized seal at the edge of the wafer, provided that all surfaces are flat and polished to limits suitable to make the rate of gas leakage low. For example, for an effective r.m.s. roughness of a 200 mm dia silicon wafer of 20 microns, and with a gas supply rate of 0.25 s.c.c.m., and l=33 mm, then the cooling rate for a gas with γ=1.5 is 1.895 watts per square centimeter for a temperature difference of eighty degrees centigrade between the wafer and platen.

Figure 7:
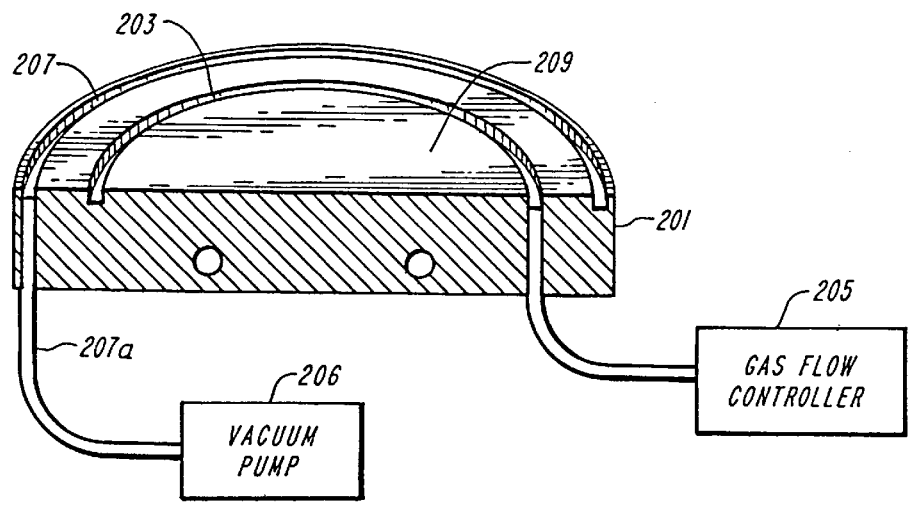
FIG. 7 shows a differential pumping embodiment of the present invention.

In a preferred embodiment of the present invention, illustrated in FIG. 7, leakage of gas into the high vacuum chamber is further reduced to a small fraction of the rate at which the gas is supplied by the flow controller 205, by providing a gas scavenger assembly along the diffusion path between the inlet orifice and the vacuum chamber. As shown in FIG. 7, platen 201 is situated in a high vacuum chamber (not shown) and a workpiece (not shown for clarity) is placed upon the flat surface 209 of the platen. Gas is introduced through the first annular groove 203, and a second annular groove 207 (or ring of holes) located radially outward from groove 203 surrounds the inlet. Preferably the second groove is located approximately one and a half millimeters inwardly from the outer edge of the platen 201. The second groove 207 connects via a passage to a mechanical vacuum pump 206 that provides differential pumping, i.e. pumping to a vacuum level higher than the manifold pressure of inlet 203, and close to or even higher than the vacuum level in the surrounding chamber. As the cooling or heating gas leaks radially outward in the interstitial space, it enters this groove, and the greater part of it is removed from the system by pump 206 without traveling further outward or leaking into the high vacuum chamber. Thus, the cooling gas does not compromise the high vacuum environment in which the wafer is processed. One or more large conduits 207a lead from the scavenging groove 207 to the pump 206, making the conductance of the path from groove 207 to pump 206 substantially greater than the conductance from groove 207 into the vacuum chamber, thus favoring scavenging of gas along the out-diffusion route.

Figure 8A:
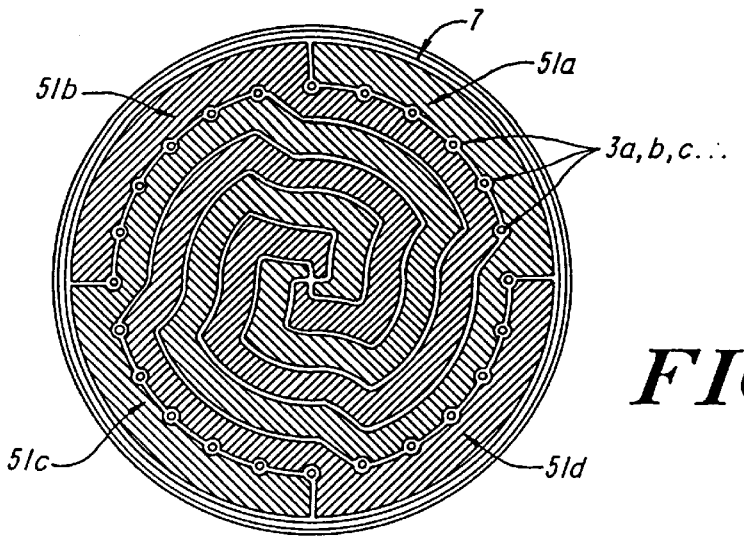
FIG. 8a shows a top view of an electrostatic clamping embodiment of the present invention.
Figure 8B:
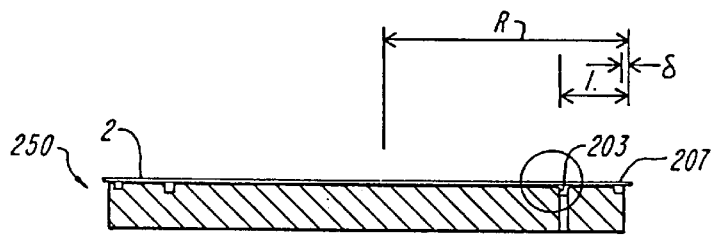
Figure 8C:
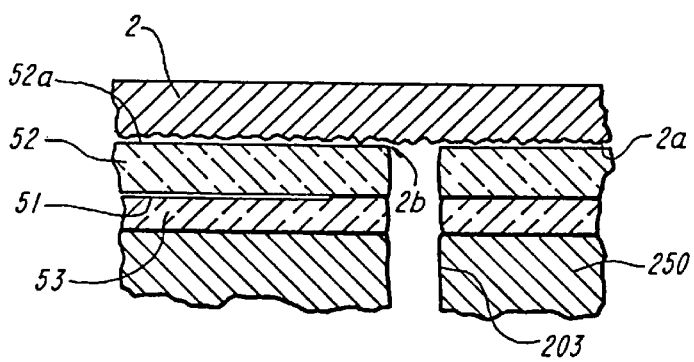

Another preferred embodiment 250 is illustrated in FIGS. 8a, 8b and 8c. The platen of this system includes an electrostatic clamp to apply pressure which holds the wafer workpiece to the platen. This method works well for conductive workpieces. The technique is similar to that described by J. Ballou, K. Carson, W. Frutiger, J. Greco and R. Kaim in *Proceedings of the Ion Implantation Technology Conference IIT '94*. Catania Italy.

As best seen in the top view, FIG. 8a, the workpiece-contacting (front) surface of the platen 250 includes a flat lapped and polished sheet of a dielectric material, 52, composed, for example, of aluminum oxide, with a thickness preferably between about (0.15)–(0.2) millimeters, and which forms a plurality of operative charging regions defined by a metallized electrode pattern deposited on its back surface. The metallized back pattern provides a set of plural electrodes 51 of approximately equal area, preferably differing by under one-quarter of one percent. In the illustrated embodiment, four electrodes 51a, 51b, 51c, 51d of spiral shape, each approximately ten millimeters in width and less than one-quarter millimeter thick, and each electrically separated from the others by a small in-plane gap of up to several millimeters or more, define a set of closely spaced charging regions that collectively cover the front surface of the platen. Advantageously, the electrodes are long and thin, and each covers a path along a dispersed region of the circular wafer that is interdigitated with the other electrode regions. The spiral form, however, is not itself critical, but merely represents one option for forming such a regular electrode pattern, and deviations from a regular plane spiral shape may also be made to accommodate electrode connections or when convenient for other reasons. In general, however, the regular electrode pattern is preferably formed of regions that are not large isolated blocks, and do not correspond to nodal regions of lower order wafer resonances, so that the necessary fluctuations in force caused by the clamp drive signals cannot induce large mechanical vibrations. In FIG. 8a, the flat conductive workpiece 2 of the polished dielectric layer 52 is omitted for clarity, and electrodes 51 are shown visible through the dielectric layer 52, which is typically transparent or translucent.

FIG. 8b shows a vertical section through the platen 250, with a wafer 2 of radius R lying flat on the platen surface so that it covers the gas introduction inlet 203 positioned at radial distance of (R-1), from the center and also covers the gas scavenging groove 207, lying at a distance δ inward from the wafer edge. The view of FIG. 8c is an enlargement of part of the cross section to more clearly illustrate the layered construction. Workpiece 2 is shown. Its plate-contacting surface 2a has micro-roughness as described above, which forms the roughened ceiling of a crack-like opening 2b allowing the passage of gas, while the alumina dielectric layer 52 has a generally smoother and flatter surface 52a, which may, for example, be optically polished and which acts as a floor of the gas-filled space. Electrodes 51 are sandwiched between the alumina dielectric layer 52 and another dielectric layer 53, which may be a hard inorganic material like layer 52 or may be an organic polymer and which also effects a bond to the underlying body of platen 250.

The entire top surface of this assembly is preferably lapped to a flatness of (0.0125) millimeters or better, and polished to a finish which is preferably better than about eight micro inches, i.e., (0.2) micrometers r.m.s. The dielectric layer 52 is bounded by the groove 207, and the upper face of the outer wall of this groove is also lapped and polished, forming part of the same flat plane as the top of layer 52.

Figure 9:
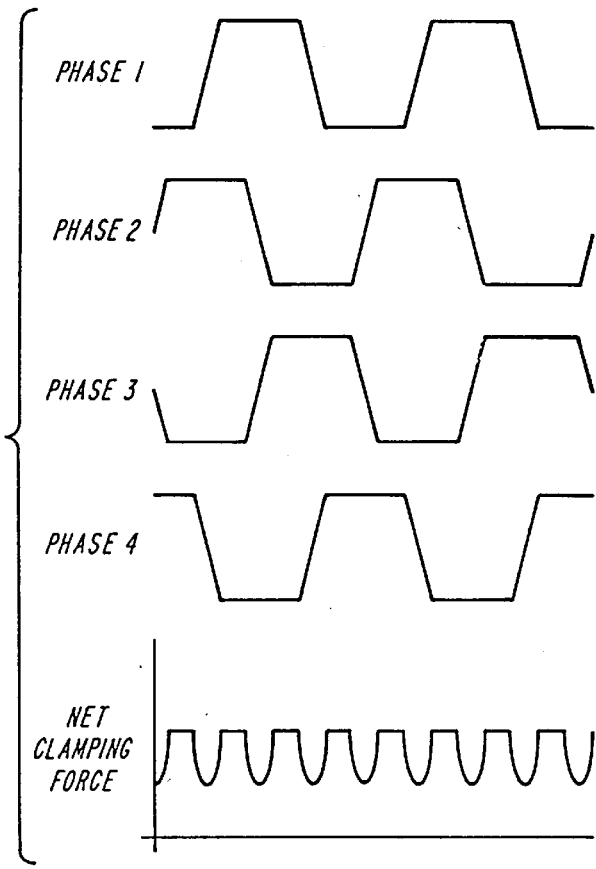
FIG. 9. shows electrical waveforms used in a preferred embodiment of the electrostatically clamped apparatus, and the resultant force developed.

To operate the illustrated surface construction of dielectric and electrode regions to electrostatically clamp a wafer, alternating voltages with a trapezoidal waveform are applied to the electrodes 51a, 51b, 51c, and 51d at a frequency of about thirty to sixty Hz. FIG. 9 indicates a set of signal waveforms and p referred phase relationships for these clamp operating signals. Each signal is a periodically repeating trapezoidal wave shape that ramps up and down between an upper potential u and a lower potential l, and each is identical to the others except for phase, the first and fourth being of opposite phase, as are the second and third signals, while the first and second signals are shifted by a quarter period with respect to each other. The wafer 2 lying on top of layer 52 serves as a common electrode for charging all four of the dielectric regions over the spiral electrode arms 51a–51d, and the applied voltages generate an electric field of about 5 MV/m or more between the electrodes and the surface of the wafer.

The instantaneous clamping pressure P above one electrode is approximately given by:

$$P = \frac{-\epsilon_0 \epsilon^2 V^2}{2t^2} \quad (5)$$

where $\epsilon_0$ is the permitivity of free space, $\epsilon$ is the dielectric constant of the dielectric material (which is about 9 to 10 for aluminum oxide), V is the applied voltage, and t is the thickness of the dielectric, which as noted above, is of a dimension much greater than the surface roughness of the dielectric or of the back surface of the workpiece being clamped, and is also much greater than the large-scale variation from flatness across each of these surfaces. The net clamping force on the wafer as a whole, shown in the fifth line of FIG. 9, dips during the voltage switching intervals. To prevent significant vibration, the width of the electrodes is small, preferably under ten millimeters. This reduces the amplitude of any vibration, and raises the resonant frequencies of any vibrational modes which might be excited in the wafer or platen, ensuring that the vibration induced by the spatially- and time-varying clamping forces is far removed from any mechanical resonance of the platen or workpiece.

In the preferred embodiment four electrodes shaped in a spiral pattern are used, and a four-phase a.c. trapezoidal waveform is applied. The electrodes are arranged in pairs that receive actuating signals that are exactly out of phase, with one signal ramping up while the other signal of a pair is ramping down. Furthermore, while the electrode of one region of dielectric is experiencing a changing potential, another region is clamped with a fixed voltage at maximum magnitude so the dips occur in isolated regions. The invention also contemplates clamping with larger even numbers of electrodes and phases. By providing an even number of phases, applicant ensures that the potential of the wafer is unaffected by the application of the electrostatic clamping signal waveforms. There is thus no need to ground the wafer, since the total current to the wafer at any time is null. The phase sequence is applied to non-sequential electrodes, for example 1-2-4-3 or 1-3-4-2; this removes any "motoring" component from the forces imparted to the wafer and avoids generating traveling waves which would have a tendency to move the wafer in a single direction.

The foregoing constructions rely on extreme closeness between the wafer and the platen to assure efficient cooling and to a lesser extent effective clamping. However, particles do arise in the processing environment, and in the event that a particle lands on the platen and accidentally separates the workpiece from the platen, certain consequences will occur from resulting changes in surface spacing. First, thermal transfer will be greatly reduced according to equations (2) and (3), since the distance from the workpiece to the platen is increased. The differential pumping may also become ineffective to maintain the desired pressure under the wafer, since with a controlled gas flow, the flow into the vacuum chamber can rise to no higher than the controlled gas flow rate, and with excessive leakage, this rate may be inadequate to maintain the desired level of thermal transfer. Furthermore, the current flowing to the electrodes of the electrostatic clamp will be reduced when the wafer is not in intimate contact with the dielectric, since the introduction of an additional air gap between the wafer and the back electrodes greatly decreases capacitance. Applicant exploits this latter feature by monitoring clamp current for example, with threshold detectors. The threshold crossing may trigger an alarm. That is, automatic measurement of this current immediately indicates the presence of a particle and/or incorrect placement of the workpiece.

By contrast, in prior art systems, the presence of debris on the platen might cause a mechanical clamp to break the wafer, or could grind the particle into the surface of the platen causing longer lasting damage, and such a problem would generally be undetected until after a number of wafers had been processed and the processing had resulted in observable defects. Also, in contrast to the harmless consequences on applicant's gas flow, in a system even without a mechanical clamp but in which the gas pressure rather than its flow regulated, then rather than being self-limiting, the resultant leakage into the high vacuum chamber could be a catastrophic event that harms process equipment and overloads high vacuum pumps.

Figure 10:
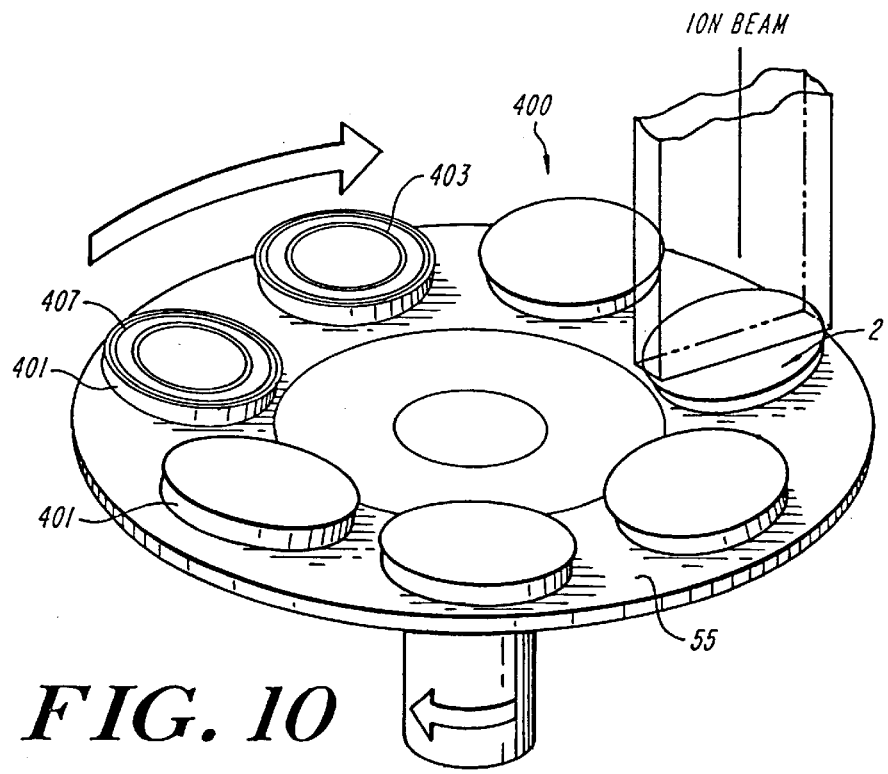
FIG. 10 shows an embodiment of the present invention in which centrifugal force clamps the workpiece to a fluid heated or cooled mounting member.

In yet another embodiment of a system 400 of the present invention shown in FIG. 10, a set of platens 401 similar to those shown in FIG. 4 or FIG. 7 are mounted to a spinning disk or drum 55 in a surface region that is inclined with respect to the plane of rotation such that centripetal force urges each wafer against the face of the platen as the wafers are rotated past a treatment station. Analogously, a set of radial arms (as shown in Robinson et al., U.S. Pat. No. 4,733,091) may be used to impart such a centrifugal clamping mechanism. By tilting the platens so that the wafer-contacting surfaces face slightly towards the axis of rotation, a component of centripetal force is developed, which acts to press the workpieces onto the platens while holding them in an orientation for processing. The clamping pressure is given by $$P = \rho t_w r \omega^2 \sin \alpha \qquad (6)$$

where $\rho$ is the density of the workpiece, $t_w$ is its thickness (which is assumed uniform), r is the mean radius of revolution, $\omega$ is the angular velocity, and $\alpha$ is the angle between a radius and the cooling/heating surface. An angle of five to ten degrees is sufficient at reasonable drum rotation rates to secure the wafers flat enough for conductive gas thermal transfer cooling in accordance with this invention.

It will be understood that the invention disclosed herein, although mainly described as applied to circular semiconductor wafers, is readily adapted to other shapes and other materials, e.g., to square or rectangular flat substrates such as sensors, flat panel displays, and other shapes or articles requiring vacuum treatment. In such cases, the peripheral gas introduction channel or ring, and the scavenging or differential pumping ring, if one is used, will in general each lie on a non-circular contour. The principal of operation is in other respects similar, and for non-circular substrates the advantages of distributed clamp force and uniform heat transfer characteristics may be expected to offer even more significant improvements over presently available workholders and thermal control systems. The invention being thus disclosed and explained, other variations and modifications will occur to those skilled in the art, and are intended to be within the scope of the invention per defined by the claims appended hereto.

What is claimed is:

1. Apparatus for clamping a flat thin conductive workpiece to a mounting member, the mounting member having at least a flat top layer of dielectric material, a conductive sublayer divided into a pattern of at least four electrodes, and an underneath layer of dielectric material wherein the electrodes are all of substantially equal area and are of generally spiral form.

2. In a method of electrostatic clamping for providing substantially uniform pressure between a flat thin conductive workpiece and a mounting member, said mounting member comprising at least a top layer composed of flat dielectric, a second layer of metal divided into a pattern of at least four electrodes of substantially equal area, and a third layer of dielectric, the additional steps of:

arranging that the electrodes extend next to each other in a sequence, providing alternating voltages of equal amplitude and of equally spaced phase to each of said electrodes, connecting said voltages to the electrodes to introduce electrostatic clamp forces for clamping the workpiece to the mounting member, and said electrodes extending in pairs along turning paths to effectively limit magnitude of vibration induced in the workpiece.

3. The method of claim 2, wherein the step of arranging includes arranging that said electrodes are patterned electrodes of generally spiral form, thereby reducing magnitude of vibrations induced in the workpiece by said alternating voltages.

4. In a method of electrostatic clamping for providing substantially uniform pressure between a flat thin conductive workpiece and a mounting member, said mounting member comprising at least a top layer composed of flat dielectric, a second layer of metal divided into a pattern of at least four electrodes of substantially equal area, and a third layer of dielectric, the additional steps of:

arranging that the electrodes extend next to each other in a sequence, providing alternating voltages of equal amplitude and of equally spaced phase to each of said electrodes, connecting said voltages in non-sequential order to the electrodes to introduce a dynamic and non-motoring pattern of electrostatic clamp forces for clamping the workpiece to the mounting member, the step of arranging including arranging that said electrodes are patterned electrodes of generally spiral form, thereby reducing magnitude of vibrations induced in the workpiece by said alternating voltages.

5. The method of claim 4 further comprising the step of monitoring current provided to the electrodes to detect presence of the workpiece on said mounting member and to determine its degree of contact therewith.

* * * * *